United States Patent [19]

Kato et al.

[11] Patent Number: 5,001,344

[45] Date of Patent: Mar. 19, 1991

[54] SCANNING ELECTRON MICROSCOPE AND METHOD OF PROCESSING THE SAME

[75] Inventors: Makoto Kato, Kawasaki; Koichi Homma; Fuminobu Komura, both of Yokohama; Toshihiro Furuya; Shinobu Otsuka, both of Katsuta, all of Japan

[73] Assignee: Hitachi, Ltd., Tokyo, Japan

[21] Appl. No.: 390,731

[22] Filed: Aug. 8, 1989

[30] Foreign Application Priority Data

Aug. 26, 1988 [JP] Japan .................. 63-210719

[51] Int. Cl.⁵ .................. H01J 37/29; H01J 37/28
[52] U.S. Cl. .................. 250/307; 250/310; 250/397
[58] Field of Search .............. 250/306, 307, 309, 310, 250/397

[56] References Cited

U.S. PATENT DOCUMENTS

| | | | |
|---|---|---|---|
| 4,588,890 | 5/1986 | Finnes | 250/307 |
| 4,725,730 | 2/1988 | Kato et al. | 250/307 |
| 4,818,874 | 4/1989 | Ishikawa | 250/397 |
| 4,835,385 | 5/1989 | Kato et al. | 250/307 |
| 4,912,313 | 3/1990 | Kato et al. | 250/307 |

FOREIGN PATENT DOCUMENTS

62-6112  1/1987  Japan .

Primary Examiner—Bruce C. Anderson
Attorney, Agent, or Firm—Antonelli, Terry, Stout & Kraus

[57] ABSTRACT

An image generated by the detected signals of a scanning electron microscope is divided, for example, into a plurality of rectangular small areas with the boundaries parallel to the y-axis. The relative height in the boundary is obtained by conducting one dimensional integration for respectively boundaries. Thereafter, the relative height difference between the boundaries is determined by conducting one dimensional integration for each area in the direction perpendicular to the boundary. Thereby, the surface three dimensional topography having less distortion can be measured, even in case errors are included in the normal distribution which indicates the surface topography of the specimen, by adjusting and determining the height in the area by the interporating operation.

40 Claims, 6 Drawing Sheets

CONTOUR LINE REPRESENTATION

FIG. 7(b)

BIRD'S-EYE VIEW REPRESENTATION

FIG. 7(c)

ARBITRARY SECTIONAL SHAPE REPRESENTATION

FIG. 8(a)

PSEUDO-COLOR REPRESENTATION

FIG. 8(b)

HEIGTS OF SPECIFIED POINTS REPRESENTATION

FIG. 8(c)

A BIRD'S-EYE VIEW ON WHICH ORIGINAL GRAY LEVELS OF THE IMAGE ARE MAPPED

SCANNING ELECTRON MICROSCOPE AND METHOD OF PROCESSING THE SAME

BACKGROUND OF THE INVENTION

1. Field of the Invention

The present invention relates to a scanning electron microscope having a plurality of detectors and particularly to a scanning electron microscope providing an operation unit for computing surface topography from a two dimensional normal distribution and a method of processing the same.

2. Description of the Prior Art

The method for obtaining a topography of a specimen surface from the two dimensional distribution of a normal vector is now used as the method to obtain a cubic topography by picking up a plurality of images in different positions of a light source. The method obtains the direction of a normal vector without changing the relationship between a point of view and a specimen (called Photometric Stereo method, PMS). Another method to compute a topography is by providing a plurality of detectors to a scanning electron microscope (hereinafter abbreviated as SEM) based on the same principle and by obtaining the normals using images formed from the signals of the detectors (called SEM-PMS method). For example, the Computer Graphics and Image Processing Vol. 18, pp. 309-328 (1982)) employs the following method (notation is changed). The normal vector $n(x,y)=(-p(x,y), -q(x,y),1)$ is obtained on the lattice points of $-i_0 \leq x \leq i_0$, $-j_0 \leq y \leq j_0$. However, when the formula of the surface to obtain a topography is expressed by $z=f(x, y)$ with the z axis indicating the height direction, $p=\partial f/\partial x$, $q=\partial f/\partial y$. From the two dimensional distribution of of normal vector, the surface topography is obtained in the following procedures (hereinafter, normal distribution is integrated or successively added (hereinafter called integration and the equivalent operation)).

(1) A desired height $z_0$ is given to the origin.

$$z(0,0)=z_0$$

(2) Integration and the equivalent operation is carried out for x and y axes from the origin.

$$z(i,0) = z(i-1,0) + \tfrac{1}{2} \{p(i,0) + p(i-1,0)\}$$
$$1 \leq i \leq i_0$$

$$z(i,0) = z(i+1,0) - \tfrac{1}{2} \{p(i,0) + p(i+1,0)\}$$
$$-i_0 \leq i \leq -1$$

$$z(0,j) = z(0,j-1) + \tfrac{1}{2} \{q(0,j) + q(0,j-1)\}$$
$$1 \leq j \leq j_0$$

$$z(0,j) = z(0,j+1) - \tfrac{1}{2} \{q(0,j) + q(0,j+1)\}$$
$$-j_0 \leq j \leq -1$$

(3) Heights of quadrants are externally integrated.

(3-1) First quadrant:

$z(i,j)$ is obtained by the following formula when $z(i-1,j)$ and $z(i,j-1)$ are already obtained.

$$z(i,j) = \tfrac{1}{2} \, [\{z(i-1,j) +$$

$$\tfrac{1}{2}(p(i-1,j) + p(i,j))\} + \{z(i,j-1) + \tfrac{1}{2}(q(i,j-1) + q(i,j))\}]$$

This formula corresponds to a mean value of the height obtained from $z(i-1, j)$ using the differential coefficient of x or approximated differential coefficient (hereinafter referred to as differential coefficient and the equivalent) and the height obtained from $z(i, j-1)$ using the differential coefficient and the equivalent.

(3-2) Second quadrant:

$z(i,j)$ is obtained from $z(i+1,j)$, $z(i,j-1)$.

$$z(i,j) = \tfrac{1}{2} \, [\{z(i+1,j) -$$

$$\tfrac{1}{2}(p(i+1,j) + p(i,j))\} + \{z(i,j-1) + \tfrac{1}{2}(q(i,j-1) + q(i,j))\}]$$

(3-3) Third quadrant:

$z(i,j)$ is obtained from $z(i+1,j)$, $z(i,j+1)$.

$$z(i,j) = \tfrac{1}{2} \, [\{z(i+1,j) -$$

$$\tfrac{1}{2}(p(i+1,j) + p(i,j))\} + \{z(i,j+1) - \tfrac{1}{2}(q(i,j+1) + q(i,j))\}]$$

(3-4) Fourth quadrant:

$z(i,j)$ is obtained from $z(i-1,j)$, $z(i,j+1)$.

$$z(i,j) = \tfrac{1}{2} \, [\{z(i-1,j) +$$

$$\tfrac{1}{2}(p(i-1,j) + p(i,j))\} + \{z(i,j+1) - \tfrac{1}{2}(q(i,j+1) + q(i,j))\}]$$

The method indicated in the reference conducts successively and externally the integration and the equivalent operation from the origin. In case an error is not included in the normal distribution, accurate surface topography can be obtained by the integrations in any procedures. However, in many cases, the normal distribution is a measured value and includes an error. The method of the reference provides a problem that an error is accummulated with the proceeding of the external integration and a large distortion is generated at the peripheral area.

Figure 9A:
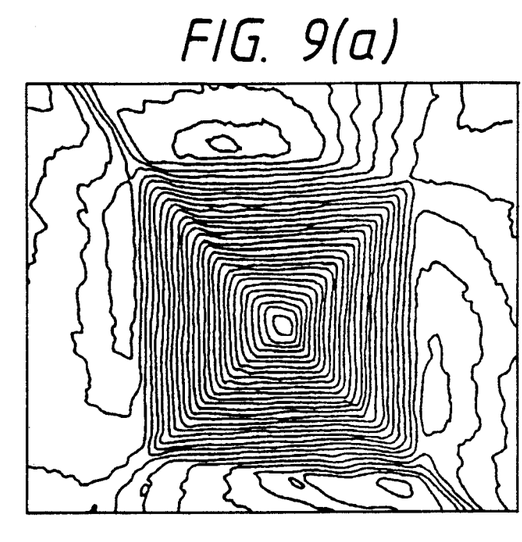
FIGS. 9(a),(b) are results of measurement.

FIG. 9(a) is a contour display as a result of the application of the prior art method to the pyramid-like recessed area, wherein large distortions are generated at the four corners (particularly, upper left and lower right points).

Japanese Patent Laid-open No.-6112 is related to the above-described method.

The prior art suffers from a problem that errors give large distortions to the results of integrations when errors are included in the normal distribution.

SUMMARY OF THE INVENTION

It is an object of the present invention to provide a scanning electron microscope including a calculation unit for computing a surface topography with less distortion even when errors are included in the normal distribution and the method of processing the same. Moreover, the present invention relates to a method of displaying the results of the processing with gray level image and color image or with color image.

Therefore, in the scanning electron microscope of the present invention, an original function is estimated from a one dimensional distribution of a certain range of an differential coefficient and an equivalent of respective variables of a single value continuous function of two variables. A specimen region to be estimated is divided, for example, into rectangular small areas having a straight line parallel to a y axis used as a boundary. The differential coefficient and the equivalent on the boundaries of the small areas is calculated by integration and the equivalent operation in the one dimensional direction. The results are obtained as an estimated value of the relative function in the small areas. Small areas are one dimensionally integrated or calculated by the equivalent operation in the direction perpendicular to such boundaries. Differences between relative functional values of respective boundaries are determined by the results of such calculations. If the one dimensional integration of small areas between boundaries does not match the estimated values of the functions computed on the boundaries, the estimated values in the small areas are adjusted by interpolation operations such that these are made equal the surface topography is then computed from the two dimensional normal distribution. Moreover, the gray level of a sheet of original image is displayed as luminosity, while the computed distance is displayed as the hue.

Figure 9B:
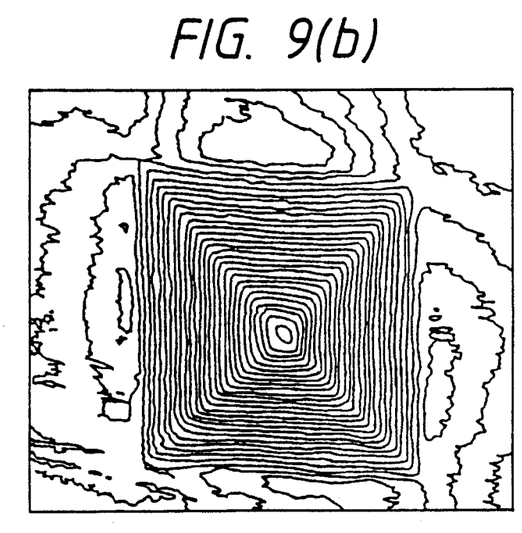

The prior art has generated large distortion due to noise included in the direction of normal being accummulated, but according to the present invention, large distortion by accummulation of distortion is not generated since distortion by noise is not propagated to the other areas due to the adjustment within the respective small areas. FIG. 9 (b) shows the results of processing by the method of the present invention using display of contours where large distortions are not generated.

Moreover, the display in height in single point and display of a bird's eye view on which original gray levels of the image are mapped can also be selected through a combination of results with the luminosity and hue.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

The principle of performing calculations in the present invention will be explained. When the number of boundaries of a plurality of rectangular small areas having the boundaries parallel to the y axis is $n+m+1$ and the formula of boundary is $x=x_k$ ($-m \leq k \leq n$), the following relationship is established.

$$-i_0 = x_{-m} < x_{-m+} < \ldots < x_0 l < \ldots < x_n = i_0$$

The sequence of integration is as follows:

(1) A desired height $z_0$ is given to the intagration start point.

$$z(x_0, 0) = z_0$$

(2) Integration is carried out on $x = x_0$ using y differentiation.

$$z(x_0, j) = z(x_0, j-1) + \tfrac{1}{2} \{q(x_0, j) + q(x_0, j-1)\}$$
$$1 \leq j \leq j_0$$

$$z(x_0, j) = z(x_0, j+1) - \tfrac{1}{2} \{q(x_0, j) + q(x_0, j+1)\}$$
$$-j_0 \leq j \leq -1$$

(3) Integration is carried out from $x = x_0$ to $x = x_1$ using x differentiation . . . .

$$z(i, j) = z(i-1, j) + \tfrac{1}{2} \{p(i, j) + p(i-1, j)\}$$
$$x_0 + 1 \leq i \leq x_1$$

(4) An average av1of height of each point on $x = x_1$ calculated in the step (3) is obtained.

$$av1 = \frac{1}{2j_0 + 1} \sum_{j=-j_0}^{j_0} z(x_1, j)$$

(5) A temporary height $z_1'$ is given to the integration starting point in the direction y on the $x = x_1$.
$$z(x_1, 0) = z_1'$$

(6) Integration is carried out in the direction y using the y differentiation from the integration starting point in the step (5). For the convenience, the calculation of height is indicated by $z'(i,j)$.

$$z'(x_1, j) = z'(x_1, j-1) + \tfrac{1}{2} \{q(x_1, j) + q(x_1, j-1)\}$$
$$1 \leq j \leq j_0$$

$$z'(x_1, j) = z'(x_1, j+1) - \tfrac{1}{2} \{q(x_1, j) + q(x_1, j+1)\}$$
$$-j_0 \leq j \leq -1$$

(7) An average av2 of $z'(i,j)$ is calculated on $x = x_1$.

$$av2 = \frac{1}{2j_0 + 1} \sum_{j=-j_0}^{j_0} z'(x_1, j)$$

(8) The result of $av1 - av2$ is added to $z'(i,j)$ on $x = x_1$. As a result, the average values of $z(x, j)$ and $z'(x_1, j)$ on $x = x_1$ become equal to av1. This value is considered as the final value of $z(x_1, j)$.

$$z(x_1, j) = z'(x_1, j) + (av1 - av2)$$

(9) The values of $z(i,j)$, $x_0 + 1 \leq i \leq x_1 - 1$ calculated in the step (3) are adjusted so that these matches a value of $z(x_1, j)$ in the step (8). For the convenience, the value $z(i,j)$ calculated in the step (3) is expressed as $z''(i,j)$.

$$z(i,j) = z''(i,j) + \frac{i - x_0}{x_1 - x_0} \{z(x_1, j) - z''(x_1, j)\}$$

$$x_0 + 1 \leq i \leq x_1 - 1, \ -j_0 \leq j \leq j_0$$

Where, $z(x_1,j)$ in the right side of formula has been determined in the step (8).

With the processing described above, all values of $z(i,j)$ in the range of $x_0 \leq i \leq x_1$ have been determined. Similar processings conducted for the other small areas. Since $z(i,j)$ on $x=x_1$ is already obtained, $z(i,j)$ in the range of $x_1 < \leq X_2$ can be obtained by replacing $x_0$, $x_1$ with $x_1$, $x_2$ respectively. $z(i,j)$ for x up to $x_n = j_0$ can be computed by repeating such calculations. Computation of $z(i,j)$ for x up to $x = x_{-m} = -j_0$ can be conducted in the negative direction from $x = x_0$.

Figure 1:
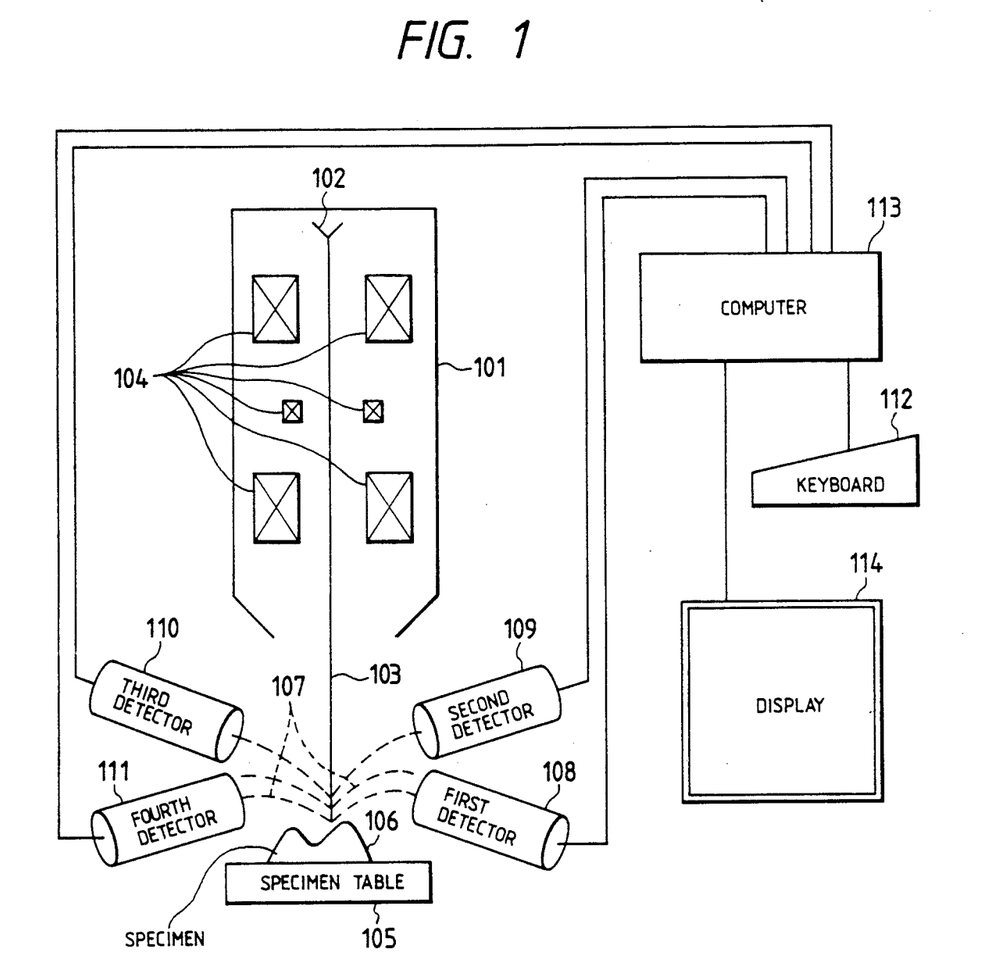
FIG. 1 is a hardware constitution of the main measuring apparatus utilizing a scanning electron microscope as an embodiment of the present invention.

A three dimensional measuring apparatus using a scanning electron microscope as an embodiment of the present invention is described with reference to FIG. 1 to FIGS. 8(a),(b),(c). FIG. 1 shows the structural features of the embodiment. The electron beam 103 emitted from an electron gun 102 of the scanning electron microscope 101 is converged and deflected by an electron lens system 104 and enters the surface of a specimen 106 on the specimen table 105. To application of electron gun 103, the secondary secondary electrons 107 (or reflected electrons) are released from the specimen 106 and are detected by the first detector 108, second detector 109, third detector 110 and fourth detector 111. The signal detected are processed by a computer 113 which operates with instructions input from a keyboard 112 and the detected image and processed output image is displayed on a color display 114.

Figure 2:
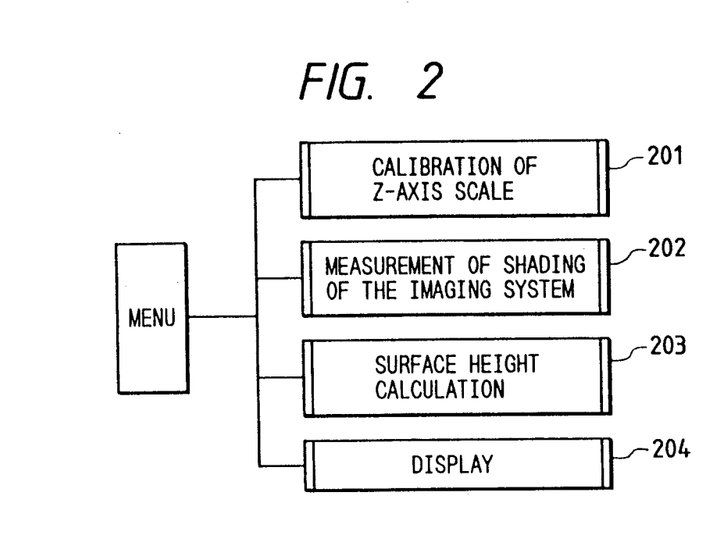
FIG. 2 is a function menu of the embodiment.

Next, FIG. 2 shows a processing menu of the apparatus. In a block 201, a scale of height is calibrated using the reference specimen of known shape. In a block 202, a measurement is carried out for compensating for fluctuation of gray level resulting from the imaging system of the SEM. A the calculation for three dimensional measurement which is the major processing of this apparatus is carried out in block 203 and in block 204, a result of the computation is displayed.

Figure 3:
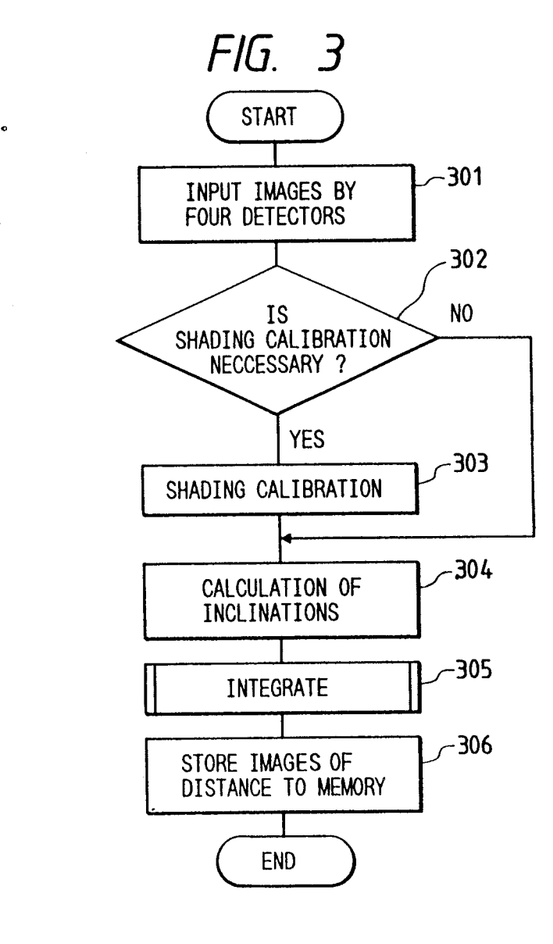
FIG. 3 and FIG. 4 are flowcharts of software of the one embodiment of the present invention.

Next, FIG. 3 is a flowchart of the processing performed in block 203 shown in FIG. 2. In block 301, an image formed by the signals from the detectors is input. The image is expressed in digital and indicated by the two dimensional arrangements $A_1$, $A_2$, $A_3$ and $A_4$. The x axis is provided in the direction connecting the first and third detectors, while the y axis in the direction connecting the second and fourth detectors. In block 302, it is judged whether the shading compensation is necessary or not. When it is necessary, the shading compensation is carried out in the block 303. Details of the shading compensation will be explained later. Next, in block 304, a gradient of each pixel of specimen surface is obtained from $A_1$, $A_2$, $A_3$ and $A_4$. For this purpose, for example, the coefficients for determining a value of k by compensation are obtained as indicated below depending on the Japanese Patent Laid-open No. 61-174917 when the vector in the direction of normal is $(-p, -q, 1)$.

$$p(i,j) = \frac{k}{2} \frac{A_3(i,j) - A_1(i,j)}{\sqrt{A_3(i,j)A_1(i,j)}} \quad (3-1)$$

$$q(i,j) = \frac{k}{2} \frac{A_4(i,j) - A_2(i,j)}{\sqrt{A_4(i,j)A_2(i,j)}} \quad (3-2)$$

Figure 4:
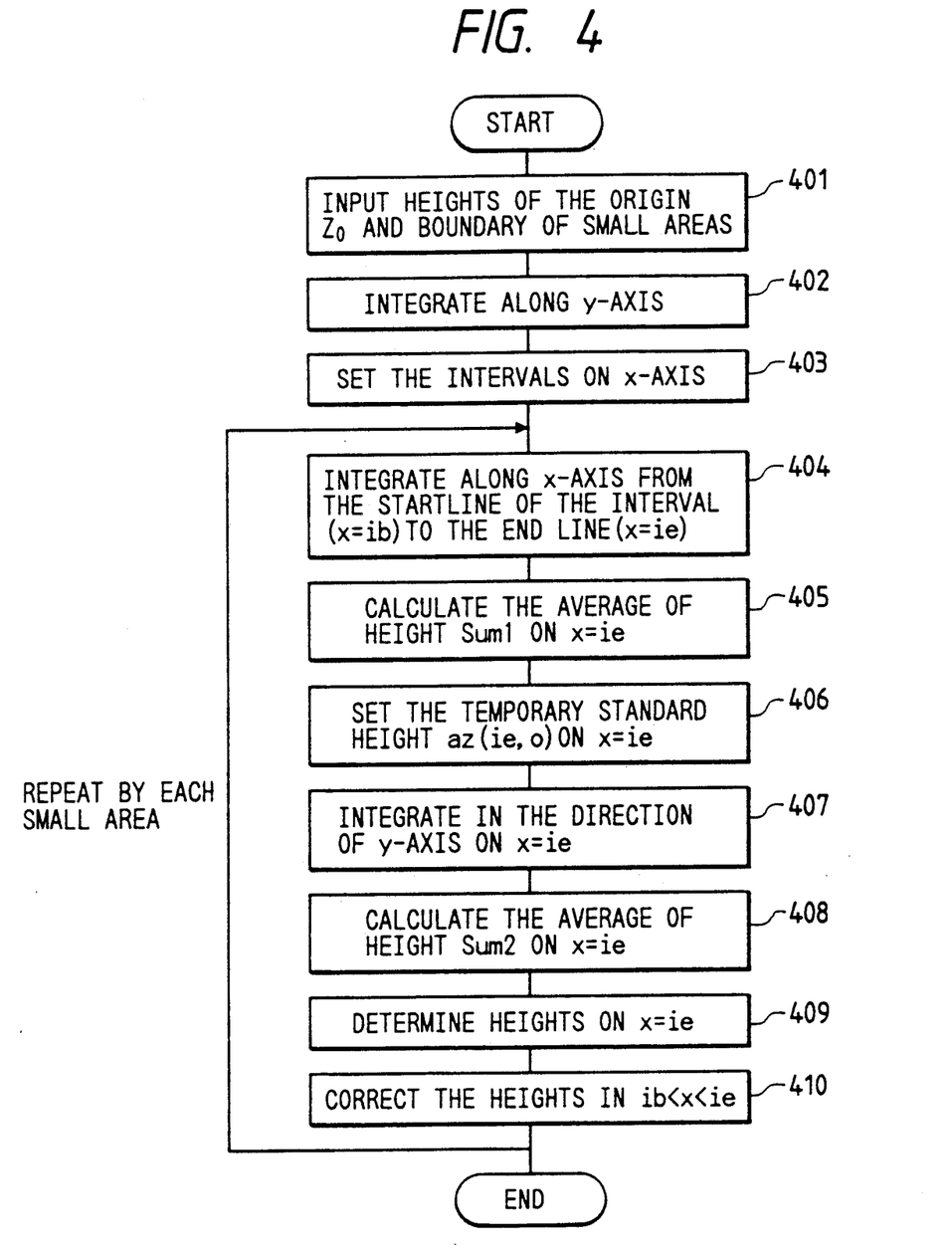

Considering the typical case, i and j are ranged as follow; $0 \leq i, j \leq 511$. In the block 305, the surface topography $z = f(x, y)$ is obtained from the arrangement of p, q obtained in the block 304. In the block 306, the result is stored in the memory of computer 113. FIG. 4 shows details of block 305 shown in FIG. 3. The integration processing conforms to the method described as the means for solving problems. In the block 401, an interval of boundaries of respective small areas is input. In the case of this embodiment, the equal boundary is set, for example, for every 50 pixels. Moreover, one of these boundaries is set on the y-axis. In the block 402, integration is carried out for the y-axis. In the block 403, the positions of boundaries are computed on the basis of designation in the block 401. The processings designated in the blocks 404 to 410 are repeated for each small area.

In this embodiment, the formulae (3-1), (3-2) are used to obtain the direction of normal, namely p and q. For this purpose, other formulae can also be used following formulae in addition to the.

$$p(i,j) = k \frac{A_3(i,j) - A_1(i,j)}{A_3(i,j) + A_1(i,j)} \quad (3-3)$$

$$q(i,j) = k \frac{A_4(i,j) - A_2(i,j)}{A_4(i,j) + A_2(i,j)} \quad (3-4)$$

Moreover, it is also possible to use a table, in place of the formula, by previously imaging the reference specimen and then summarizing correspondence between the direction of normal of the surface and pairs of gray levels. In concrete, a spherical specimen is used as the reference specimen. Since the upper half of spherical specimen includes all directions of normals, all directions of normals can be determined using the spherical specimen. When a sphere is expressed by the formula $$z = \sqrt{r^2 - (x - x_0)^2 - (y - y_0)^2} \;,$$

$$p(x,y) = \frac{\partial z}{\partial x} = -\frac{x - x_0}{\sqrt{r^2 - (x - x_0)^2 - (y - y_0)^2}}$$

$$q(x,y) = \frac{\partial z}{\partial y} = -\frac{y - y_0}{\sqrt{r^2 - (x - x_0)^2 - (y - y_0)^2}}$$

Thereby, it can be summarized using the reference specimen that the pairs $A_1(i,j)$, $A_2(i,j)$, $A_3(i,j)$, $A_4(i,j)$ of gray levels of spherical surface correspond to $p(i,j)$, $q(i,j)$. Such relationships must be searched for all points on the spherical surface. When the pairs are $A_1$, $A_2$, $A_3$, $A_4$ of gray levels of points on the spherical surface, direction of normal can be determined using such relationship.

Figure 5A:
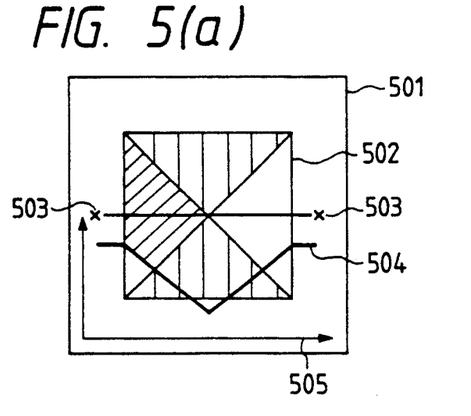
FIGS. 5(a),(b),(c) are diagrams for explaining calibration of z-axis scale.
Figure 5B:
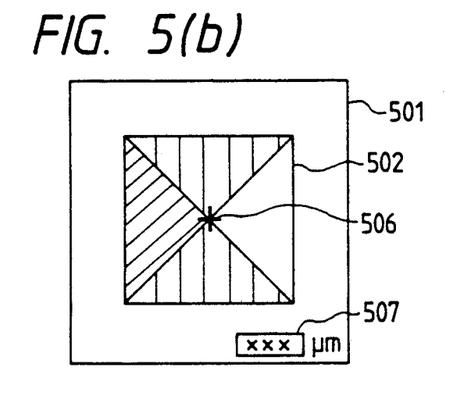
Figure 5C:
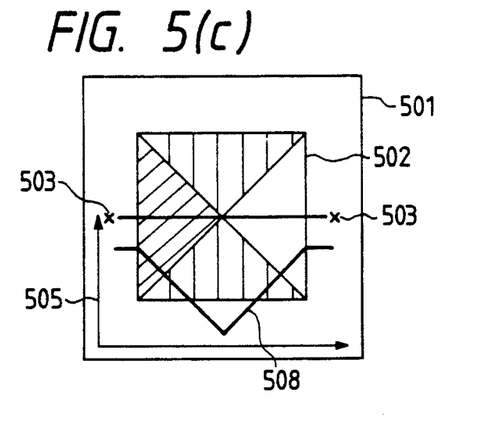

Next, calibration of z-axis in the block 201 in FIG. 2 will be explained with reference to FIGS. 5 (a), (b),(c). Values of k in the formulae (3-1), (3-2), (3-3), (3-4) must be determined. A value of k directly proportional to the height is computed. This value is ideally a constant value but since it naturally be changed depending on the measuring conditions, calibration by a specimen having a known shape is required. In this embodiment, the Vickers printing which is a pyramid-like recessed area is used as the specimen of known shape. The Vickers printing 502 is shown in the screen 501 of FIG. 5(a). The surface topography is computed by temporarily designating a value of k with the method described above and the cross-sectional shape 504 is computed for the cross-section designated by the cursor 503. A measured value a of current Vickers printing can be detected by the scale 505. In FIG. 5(b), the cursor 506 is moved to the center of Vickers printing to input the known height b at this point. However, the height at the position of cursor 503 is set to 0. Thereby, it can be understood the true value can be obtained by multiplying a value of k with b/a (FIG. 5(c)) shows the calibrated value. The value of k thus obtained is used for successive calculations.

Figure 6A:
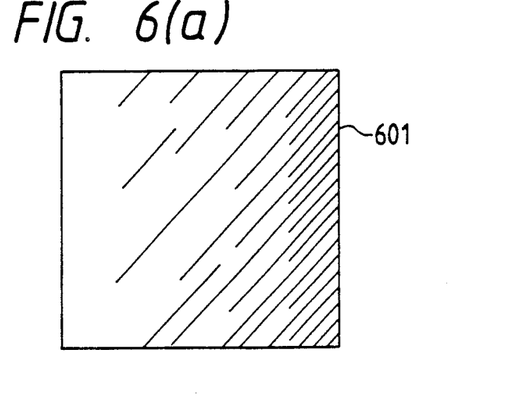
FIGS. 6(a),(b),(c) are diagrams for explaining the compensation for shading.
Figure 6B:
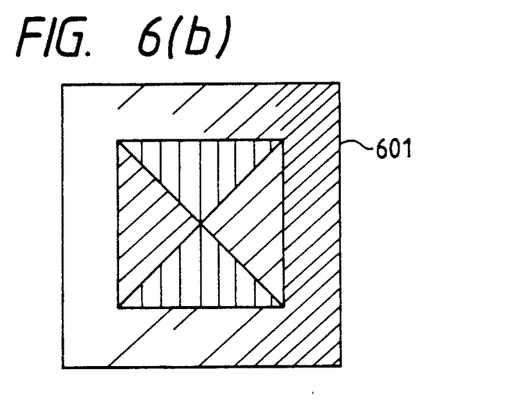
Figure 6C:
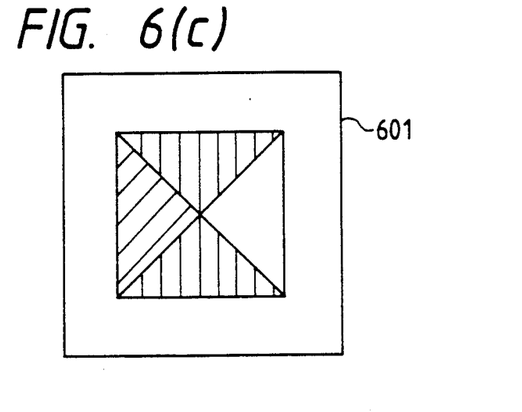

Next, measurement for shading compensation in the block 202 of FIG. 2 will be explained. This compensation is intended to eliminate ununiformity of the gray level of image generated by positional relationship between the position of detectors and the points on the specimen. In case the flat area is imaged, the gray level must become equal even when the image is obtained from any detector. However, ununiformity in the screen 601 of FIG. 6(a) is sometimes generated. Here, it is estimated that such image is expressed by the two dimensional arrangement a (t,j). This uniformity is generated in overlap as shown in FIG. 6(b) even in case the other specimen other than the flat area is imaged under the similar measuring conditions. This image is expressed as b(i,j). With reference to a point of $i=i_0$, $j=j_0$ at the center of the screen, the shading compensation can be carried out by computing $b'=(i,j)=b(i,j)/e(i,j)$ under the condition of $e(i,j)=a(i,j)/a(i_0,j_0)$. As shown in FIG. 6(c), the image having uniformity of gray level can be obtained. In the block 202 in FIG. 2, e(i,j) is determined and in the block 303 of FIG. 3, calculation of b'(i,j) is carried out. In this step, an example of compensation by storing the arrangement e(i,j) is indicated but in case e(i,j) is expressed by the polynomial of i and j, the coefficients of the polynomial are stored in place of e(i,j) and the shading compensation can be carried out. Namely, it is supposed here that e(i,j) is expressed, for example, by the following bilinear polynomial of i and j.

$$e(i,j)=\alpha(i-i_0)+\beta(j-j_0)+\gamma(i-i_0)(j-j_0)+1$$

Using $\alpha$, $\beta$, $\gamma$, b'(i,j) can be calculated and compensated under the condition of $$b'(i,j)=b(i,j)/\{\alpha(i-i_0)+\beta(j-j_0)$$
$$+\gamma(i-i_o)(j-j_0)+1\}$$

Moreover, when e(i,j) or $\alpha$, $\beta$, $\gamma$, are obtained by taking images in low magnification, e(i,j) and $\alpha$, $\beta$, $\gamma$ can be estimated and can be used at the time of taking images in high magnification. For instance, when the data of $\alpha$, $\beta$, $\gamma$ are obtained by taking an image of a flat area with magnitude S, $s\alpha/t$, $s\beta/t$, $s\gamma/t$ can be used as the compensation coefficients for shading compensation with magnitude t.

Figure 7A:
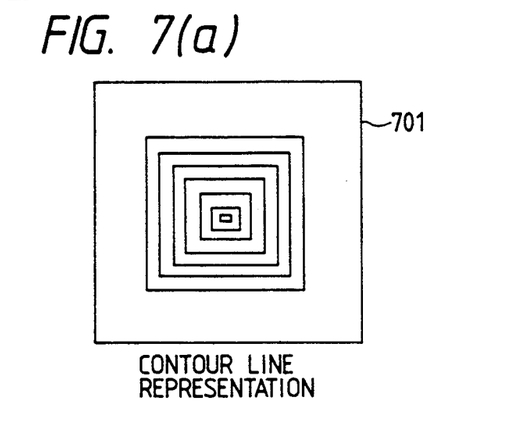
FIGS. 7(a),(b),(c) and FIGS. 8(a),(b),(c) are diagrams for explaining display method.
Figure 7B:
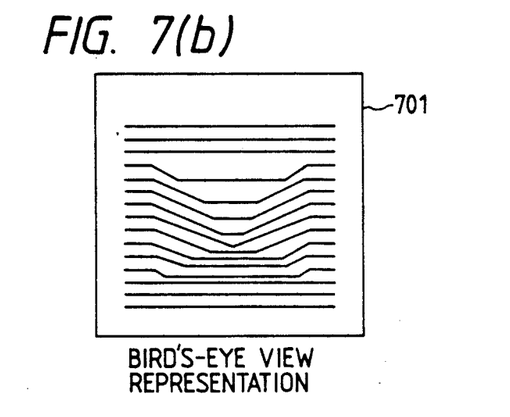
Figure 7C:
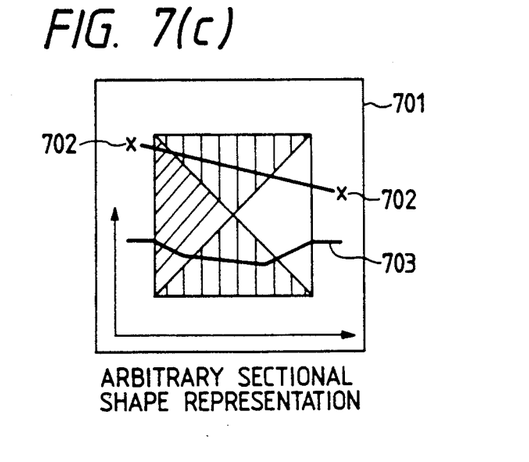
Figure 8A:
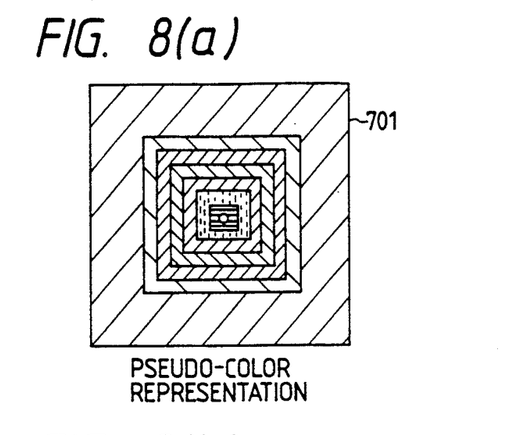
Figure 8B:
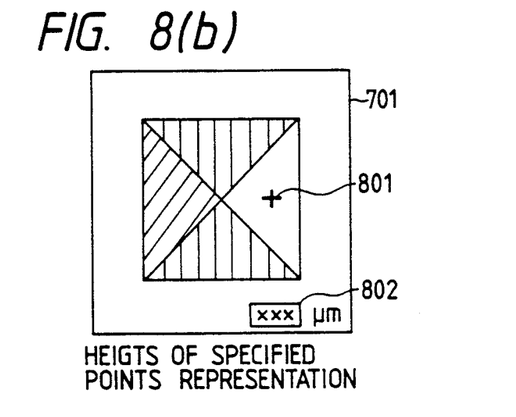
Figure 8C:
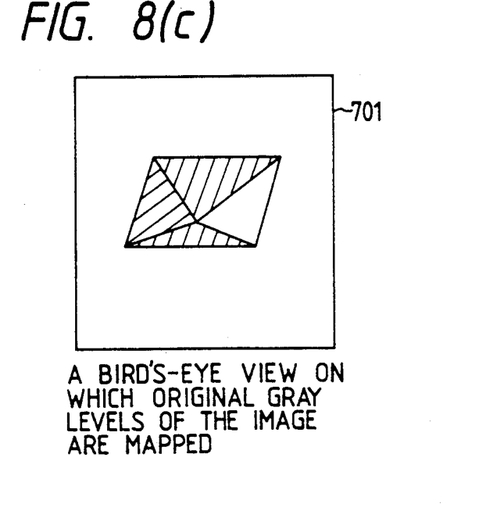

Details of the display of block 204 in FIG. 2 will be explained with reference to FIGS. 7(a),(b),(c) and FIGS. 8(a),(b),(c). In the block 306 of FIG. 3, the distance image on the specimen, namely the two dimensional arrangement z(i,j) of height is stored in the memory. From z(i,j), the contour display of FIG. 7(a), bird's eye view display of FIG. 7(b) and desired cross-sectional processing of FIG. 7(c) can be conducted. In the desired cross-sectional processing of FIG. 7(c), the desired cross-section is designated with the cursor 702 on the screen 701 and cross-section is displayed by obtaining the height of this cross-section from z(r,j). Moreover, the pseudo color display of FIG. 8(a), single point height display of FIG. 8(b) and display by mapping at the surface of bird's eye view can also be selected. The pseudo color display is carried out by assigning different colors to values of z(i,j) and estimation of single point height is made by reading the height of the area designated by the cursor 801 from z(i,j) and then displaying the value 802. Moreover, display by mapping at the surface of bird's eye view is realized by generating the scene of the surface of z(i,j) observed from the direction designated and using the corresponding gray level of a sheet of an input original image for the gray level of each point. Apparent correspondence between the result of measurement and the position of specimen surface displayed on the original image can be obtained by displaying in an overlapping fashion several displays and the input original image. Namely, the contour line and original image are displayed by overlapping the desired cross-sectional height and original image. Meanwhile, the display of the image is conducted by overlapping the original image and a pseudo color display by the manner described below. In the color display, three primary colors of red, green and blue are overlapped. When the colors are indicated by $f_r$, $f_g$, $f_b$, luminosity is expressed by $f_r+f_g+f_b$ and the hue is determined by the rate of $f_r$, $f_g$, $f_b$. For instance, in comparison with $f_r=10$, $f_g=20$, $f_b=30$ and $f_r=20$, $f_g=40$, $f_b=60$, the hue is the same and the luminosity of the former is only a half of the latter. Therefore, the pseudo color display and original image are overlapped and displayed by setting the gray level of the sheet of input original image to the luminosity and determining the hue with a value of z(i,j). Moreover, the value obtained by multiplying z(i,j) with an integer can also be displayed. In case a number larger than 1 is multiplied to z(i,j), recess and projection are emphasized in the display and these are suppressed when a positive number smaller than 1 is multiplied. When a negative number is multiplied in the display of the image, display is inverted for the front and rear sides. This display is effective for observation of the bottom of the recess in the bird's eye view.

The present invention can also be applied to another method for obtaining the direction of normal and integrating it. In place of the images of a plurality of detectors of scanning electron microscope, the images obtained by changing the position of light source can also be used on the occasion of picking up the specimen with a television camera. In this case, the position of light source is changed for three or more positions to previously observe the spherical reference specimen. With the method described above, correspondence of pairs of direction of normal of the surface and gray level of each point is previously determined, the specimen is imaged at the light source for more than three positions, of the light source and the direction of normal of the specimen surface is obtained from a pair of gray level of images of respective points.

Moreover, the direction of normal of the surface can be detected from a degree of distortion of a pattern on the image for the specimen such as a golf ball having the regular pattern at the surface thereof. It is also possible to use the normal distribution.

In addition, the four sheets of input images of the present embodiment can be obtained by rotating the specimen table using a detector fixed to the scanning electron microscope and relatively changing the position of the detector for the specimen. In the same way, the four sheets of input images can be used by employing a detector which can be rotated around the specimen within the specimen chamber.

According to the present invention, since distortion due to the error included in the normal distribution is not accummulated, it provides the effect that the surface topography having less distortion can be obtained. FIG. 9(a) shows the result of processing in which the method of prior art is applied to the pyramid-like recess. Moreover, FIG. 9(b) shows application of the present invention to such recess. In FIG. 9(a), a large distortion appears at the upper left and lower right sections but these are not generated in FIG. 9(b).

What is claimed is:

1. A method of processing a scanning electron microscope which estimates the original function value from the two dimensional distribution, within a certain range, of the differential coefficient and the equivalent of respective variables of single value continuous functions of two variables comprising the steps of:
   dividing the specimen area to be estimated into several rectangular small areas;
   conducting integration and the equivalent operation in the one dimensional direction for said differential coefficient and the equivalent on respective boundaries of said small areas and obtaining the result as the estimated value of relative functions within said small areas;
   conducting one dimensional integration and the equivalent operation for respective small areas in the direction perpendicular to the boundary and determining difference between relative function values between boundaries from the result; and
   computing the surface topography from the two dimensional distribution of the normal by adjusting the estimated values in the small areas with the interporating operation to attain the coincidence for discoincidence between the one dimensional integration result of small areas between boundaries and the estimated values of functions computed on the boundaries.

2. A method of processing a scanning electron microscope according to claim 1, wherein said functions are distribution of surface topography, namely the heights of specimen and the surface topography is computed from the two dimensional normal distribution of said distribution.

3. A method of processing a scanning electron microscope according to claim 2, wherein said differential coefficient and the equivalent is a component of the normal and the surface topography is computed from the two dimensional normal distribution of said component.

4. A method of processing a scanning electron microscope according to claim 3, wherein in regard to the normal, the surface topography is computed, in the scanning electron microscope providing three or more secondary electron detectors, from the two dimensional normal distribution obtained from at least one of the functional formula and the relationship of the direction of normal and gray level of image prepared using the reference specimen from the pairs of gray level of image of the same area of respective images generated by the signals of respective detectors.

5. A method of processing a scanning electron microscope according to claim 4, wherein said secondary electron detector is a reflected electron detector for detecting reflected electrons.

6. A method of processing a scanning electron microscope according to claim 3, wherein in regard to the normal, the relative three or more images for different positions of detectors for specimen are generated by rotating the specimen board, in the scanning electron microscope having a single secondary electron detector, and the surface topography is computed from the two dimensional normal distribution obtained by at least one of the functional formula and relationship of the direction of normal and gray level of image prepared using the reference specimen from the pairs of gray levels of images of the same area of respective images.

7. A method of processing a scanning electron microscope according to claim 6, wherein said secondary electron detector is a reflected electron detector which detects reflected electron.

8. A method of processing a scanning electron microscope according to claim 3, wherein in regard to the normal, three sheets or more of images are generated, in the scanning electron microscope having secondary electron detectors which can change position within the one specimen chamber, by changing position of detectors and the surface topography is computed from the two dimensional normal distribution obtained from at least the one of the functional formula and relationship between the direction of normal and gray level of image prepared using the reference specimen from the pairs of gray levels of image of the same area of respective images.

9. A method of processing a scanning electron microscope according to claim 8, wherein said secondary electron detector is a reflected electron detector which detects the reflected electron.

10. A method of processing a scanning electron microscope according to claim 3, wherein in regard to the normal, the surface topography is computed, in the scanning electron microscope having four secondary electron detectors, from the two dimensional normal distribution obtained by the functional formula of the gray level of images of the same area of respective images generated by the signals of respective detectors.

11. A method of processing a scanning electron microscope according to claim 10, wherein said secondary electron detector is a reflected electron detector which detects the reflected electron.

12. A method of processing a scanning electron microscope according to claim 3, wherein in regard to the normal, the surface topography is computed from the two dimensional normal distribution obtained from the relationship between the direction of normal obtained by observing the reference specimen under the same conditions and summarizing it in the form of table and the gray level of image from the pairs of gray levels of images of the same area on the three sheets or more images in which only the position of light source is changed without changing positional relationship between the point of view and the specimen.

13. A method of processing a scanning electron microscope according to claim 3, wherein in regard to the normal, the surface topography is computed from the two dimensional normal distribution obtained by distortion of regular pattern on a sheet of image obtained by observing the specimen having such pattern at the surface thereof.

14. A scanning electron microscope comprising:
   at least three secondary electron detectors for detecting secondary electrons reflected from a specimen and producing signals indicative thereof;
   means, responsive to said signals indicative of secondary electrons, for determining a two-dimensional distribution of a normal vector;

means for computing a surface topography of a surface of said specimen from said two-dimensional distribution of said normal vector; and means for displaying an image of said surface topography, said image including overlapping images of a bird's eye view of said surface topography, a diagram of contours of equal height points on said surface, a height diagram of a cross-section of said specimen and an input image of said specimen.

15. A scanning electron microscope according to claim 14, wherein at least one of said at least three secondary electron detectors is a reflected electron detector for detecting reflected electrons.

16. A scanning electron microscope comprising:

at least three secondary electron detectors for detecting secondary electrons reflected from a specimen and producing signals indicative thereof;

means, responsive to said signals indicative of secondary electrons, for determining a two-dimensional distribution of a normal vector;

means for computing a surface topography of a surface of said specimen from said two-dimensional distribution of said normal vector; and means for displaying an image of said surface topography, said surface topography being displayed by a pseudo color display method based on said surface height.

17. A scanning electron microscope according to claim 16, wherein at least one of said at least three secondary electron detectors is a reflected electron detector for detecting reflected electrons.

18. A scanning electron microscope according to claim 16, wherein said means for displaying utilizes said surface height as hue and a gray level of a sheet of an original image as luminosity in the displayed image of said specimen.

19. A scanning electron microscope according to claim 18, wherein at least one of said at least three secondary electron detectors is a reflected electron detector for detecting reflected electrons.

20. A method for displaying an image in a scanning electron microscope comprising the steps of:

calculating a height of a specimen from at least a sheet of image of said specimen; and displaying said image of said specimen, wherein said calculated height is utilized as hue in said display and a gray level of a sheet of original images of said specimen is utilized as luminosity in said display.

21. A method for displaying an image of a specimen in a scanning electron microscope comprising the steps of:

calculating a value for each point in said image in accordance with a predetermined function of a gray level; and displaying said image such that calculated value is utilized as a hue of said display image and a gray level of a sheet of original images f said specimen is utilized as a luminosity of said displayed image.

22. A scanning electron microscope comprising:

means for obtaining a two-dimensional normal distribution of a surface of a specimen having a known shape;

means for integrating said two-dimensional normal distribution so as to obtain a surface topography of said specimen;

means for calibrating a scale of a vertical direction in said electron microscope utilizing said surface topography of said specimen.

23. A scanning electron microscope according to claim 22, wherein said specimen having a known shape is a pyramid-like recess.

24. A scanning electron microscope according to claim 23, wherein said pyramid-like recess is a Vickers printing.

25. A scanning electron microscope comprising:

means for obtaining a two-dimensional normal distribution of a specimen;

means for calculating a surface topography of said specimen, said means for calculating integrating said two-dimensional normal distribution so as to obtain said surface topography;

means for producing an image of said specimen utilizing said surface topography;

means for estimating an amount of non-uniformity of gray level generated in an image system of said electron microscope using a portion of said image corresponding to a flat area of said specimen; and means for compensating for a gray level of an input image based on said estimated amount of non-uniformity.

26. A scanning electron microscope according to claim 25, wherein said non-uniformity is expressed as a polynomial of a position quadrant on said produced image.

27. A scanning electron microscope according to claim 25, wherein said means for estimating obtains said amount of non-uniformity by interpolating the gray level of the input image.

28. A method of processing in a scanning electron microscope which estimates an original function value from a two-dimensional distribution, within a certain range, of at least one of a differential coefficient and an equivalent of respective variables of single value continuous functions of two variables comprising the steps of:

dividing a specimen area to be estimated into several rectangular small areas;

conducting at least one of integration and a first equivalent operation in a one dimensional direction for at least one of said differential coefficient and said equivalent on respective boundaries of said small areas and obtaining an estimated value of relative functions within said small areas;

conducting at least one of a one dimensional integration and a second equivalent operation for respective small areas in a direction perpendicular to said respective boundaries to obtain a value of said relative functions between boundaries;

determining a difference between relative function values between boundaries and said estimated value; and computing a surface topography from a two dimensional normal distribution by adjusting the estimated value in the small areas with an interpolation operation to obtain a coincidence between the one dimensional integration result of small areas between boundaries and the estimated value of functions computer on the boundaries.

29. A method of processing in a scanning electron microscope according to claim 28, wherein said functions include distribution of surface topography including heights of a specimen and wherein the surface topography is computed from the two dimensional normal distribution of said distribution of surface topography.

30. A method of processing in a scanning electron microscope according to claim 29, wherein said at least one of said differential coefficient and the equivalent is a component of the normal and the surface topography is computed form the two dimensional normal distribution of said component.

31. A method of processing in a scanning electron microscope according to claim 30, wherein at least three images for different positions of detectors for said specimen are generated by rotating a specimen board in the scanning electron microscope, the scanning electron microscope including a single secondary electron detector, and wherein the surface topography is computed from a two dimensional normal distribution obtained by at least one of a predetermined formula and a relationship of a direction of normal and gray level of an image prepared using a reference specimen from pairs of gray levels of respective images generated from signals detected by said single secondary electron detector.

32. A method of processing in a scanning electron microscope according to claim 31, wherein said secondary electron detector is a reflected electron detector which detects reflected electrons.

33. A method of processing in a scanning electron microscope according to claim 30, wherein at least three sheets of images are generated in a scanning electron microscope having secondary electron detectors which can change position within a specimen chamber by changing position of said secondary electron detectors and wherein surface topography is computed from a two dimensional normal distribution obtained from at least one of a predetermined formula and a relationship between a direction of normal and a gray level of an image prepared using a reference specimen and pairs of gray levels of respective images generated from signals detected by said secondary electron detectors.

34. A method of processing in a scanning electron microscope according to claim 33, wherein said secondary electron detectors are reflected electron detectors which detect reflected electrons.

35. A method of processing in a scanning electron microscope according to claim 30, wherein surface topography is computed in a scanning electron microscope having four secondary electron detectors from a two-dimensional normal distribution obtained from gray levels of respective images generated by signals from respective ones of said four secondary electron detectors.

36. A method of processing in a scanning electron microscope according to claim 35, wherein said secondary electron detectors are reflected electron detectors which detect reflected electrons.

37. A method of processing in a scanning electron microscope according to claim 30, wherein surface topography of an actual specimen is computed form a two-dimensional normal distribution obtained by comparing a relationship between a direction of normal obtained by observing a reference specimen under known conditions and storing results of said observation in a table and pairs of gray levels of at least three sheets of images of said actual specimen in which only a position of a light source is changed without changing a positional relationship between a point of view and said actual specimen.

38. A method of processing a scanning electron microscope according to claim 30, wherein surface topography of a specimen is computed form a two-dimensional normal distribution obtained by distortion of a regular pattern on a sheet of image obtained by observing the specimen having such a pattern at a surface thereof.

39. A method of processing in a scanning electron microscope according to claim 29, wherein the scanning electron microscope includes at least three secondary electron detectors, said surface topography being calculated from a two-dimensional normal distribution obtained from at least one of a predetermined formula and a relationship of a direction of the normal and a gray level of an image prepared using a reference specimen from respective pairs of gray levels of respective images generated by signals from said at least three detectors.

40. A method of processing in a scanning electron microscope according to claim 31, wherein said at least three secondary electron detectors are reflected electron detectors for detecting reflected electrons.

* * * * *